US008674960B2

(12) United States Patent
Lin et al.

(10) Patent No.: US 8,674,960 B2
(45) Date of Patent: Mar. 18, 2014

(54) DETECTOR CIRCUIT AND DETECT METHOD OF A CAPACITIVE TOUCH PANEL

(75) Inventors: Chia-Hsing Lin, Hsinchu (TW);
Yi-Hsin Tao, Hsinchu (TW);
Hsuan-Wen Tseng, Taipei County (TW)

(73) Assignee: Elan Microelectronics Corporation, Hsinchu (TW)

( * ) Notice: Subject to any disclaimer, the term of this patent is extended or adjusted under 35 U.S.C. 154(b) by 746 days.

(21) Appl. No.: 12/868,069

(22) Filed: Aug. 25, 2010

(65) Prior Publication Data

US 2011/0050634 A1 Mar. 3, 2011

(30) Foreign Application Priority Data

Aug. 28, 2009 (TW) .............................. 98129041 A

(51) Int. Cl.
*G06F 3/045* (2006.01)
*H03M 1/12* (2006.01)

(52) U.S. Cl.
USPC ........................................ 345/174; 341/155

(58) Field of Classification Search
USPC ................... 345/173–178; 178/18.01, 18.06; 341/126–172
See application file for complete search history.

(56) References Cited

U.S. PATENT DOCUMENTS

| 6,738,048 B1 * | 5/2004 | Rundel ........................ 345/173 |
| 2007/0132741 A1 | 6/2007 | Chiu et al. |
| 2010/0079327 A1 * | 4/2010 | Berens et al. ................. 341/158 |
| 2010/0309035 A1 * | 12/2010 | Yue et al. ..................... 341/141 |

FOREIGN PATENT DOCUMENTS

| TW | 200723077 A | 6/2007 |
| TW | 200933463 A | 8/2009 |

OTHER PUBLICATIONS

Communication From the Taiwan Patent Office Regarding a Counterpart Foreign Application Dated (Taiwan Year 102) Mar. 5, 2013.

* cited by examiner

*Primary Examiner* — Ariel Balaoing
*Assistant Examiner* — Christopher Kohlman
(74) *Attorney, Agent, or Firm* — Rosenberg, Klein & Lee

(57) ABSTRACT

A detector circuit and detect method of a capacitive touch panel conditionally abort sensing of useless traces of the capacitive touch panel when the capacitive touch panel senses the traces thereof. For a selected trace, the trace voltage thereof is sampled to be compared with a threshold voltage. If the sampled voltage is lower than the threshold voltage, the sensing of this trace is aborted and thus the operation of the detector circuit is reduced to improve the performance of the capacitive touch panel.

5 Claims, 4 Drawing Sheets

DETECTOR CIRCUIT AND DETECT METHOD OF A CAPACITIVE TOUCH PANEL

FIELD OF THE INVENTION

The present invention is related generally to a touch panel and, more particularly, to a detector circuit and a detect method of a capacitive touch panel.

BACKGROUND OF THE INVENTION

A two-dimensional capacitive touch panel includes a plurality of X-traces and a plurality of Y-traces mutually intersected to form a plurality of sensors. When an electrically conductive article such as a finger approaches a sensor, the coupling capacitor between the finger and the sensor will increase the capacitance on the trace connected to the sensor, so a detector circuit can locate the finger on the capacitive touch panel by detecting the capacitance variations of the traces, and then convert the position coordinates into information for a host to perform corresponding operation.

In further detail, as shown in FIG. 1, when a finger touches the intersection point between a Y-trace Y1 and X-traces X4 and X5, the measured capacitances from those X-traces X1, X2, X7 and X8 that are far from the finger will not be affected by the finger and remain below a threshold $C_{TH}$, the measured capacitances from those X-traces X3 and X6 near the finger will be increased to slightly higher than the threshold $C_{TH}$, the measured capacitance from the X-trace X5 is even higher, and the measured capacitance from the X-trace X4 where the finger touches is at the peak of the curve 10 established by the measured capacitances from the X-traces X1-X8. Similarly, the measured capacitance from the Y-trace Y1 is at the peak of the curve established by the measured capacitances from the Y-traces, since the Y-trace Y1 is touched by the finger. Therefore, the capacitive touch panel can identify the touch point (X4,Y1). The capacitances on the X-traces X1, X2, X7 and X8 are not affected by the finger, so the measured capacitances therefrom are too low to be useful in the subsequent conversion and calculation for identification of the touch point.

In actual circuitry the capacitance can not be detected directly, and thus a capacitive touch panel performs the capacitance detection by charging its traces one by one and detecting the voltage variations on each of the traces to extract the capacitance variations of the traces. After conversion and processing, the position information is obtained. FIG. 2 is a circuit diagram of a conventional successive approximation register (SAR) analog-to-digital converter (ADC), in which a sample-and-hold circuit 12 samples the trace voltage Vin of a sensed trace to generate a sampled voltage Vs as an input of a comparator 14, a SAR and control circuit 18 provides a successive approximation digital code $D_0$-$D_{n-1}$ for a digital-to-analog converter (DAC) 16, with reference to a reference voltage Vref, to convert into a voltage $V_D$ as another input of the comparator 14, the comparator 14 compares the voltage $V_D$ with the sampled voltage $V_S$ to generate a comparison result for the SAR and control circuit 18, the SAR and control circuit 18 adjusts the successive approximation digital code $D_0$-$D_{n-1}$ according to the comparison result, another voltage $V_D$ is thus generated by the DAC 16 and compared with the sampled voltage $V_S$, the foregoing procedure is repeated so as for the voltage $V_D$ to approximate the sampled voltage $V_S$ step by step, and finally the digital code $D_0$-$D_{n-1}$ generated is supplied to a firmware to fill in a frame as the measured capacitance of the sensed trace.

The conventional detect methods always sense all the traces one by one with the process that charges a sensed trace and detects the trace voltage therefrom, and performs the aforesaid successive approximation and conversion to generate a digital code for this sensed trace for a firmware. After this trace is sensed, the same process is repeated to the next trace. When the digital codes of all the traces are obtained, they are used to construct a frame of information to position a touch point. Since the digital code converted from the trace voltage of a trace without significant capacitance variation is useless, the present invention proposes a method for pre-filtering those useless traces to reduce the operation of the detector circuit, thereby either increasing the frame speed or reducing the power consumption, to improve the performance of a capacitive touch panel.

SUMMARY OF THE INVENTION

An object of the present invention is to provide a circuit and method for conditionally aborting sensing of useless traces of a capacitive touch panel when the capacitive touch panel senses the traces thereof.

According to the present invention, a detector circuit of a capacitive touch panel includes a sample-and-hold circuit to sample the trace voltage of a selected one of the traces of the capacitive touch panel to generate a sampled voltage, a SAR and control circuit to provide a threshold digital code and a successive approximation digital code and to provide a pre-conversion signal when beginning to convert the sampled voltage, a DAC to convert the threshold digital code into a threshold voltage or the successive-approximation digital code to a comparison voltage, a multiplexer to provide either the threshold digital code to the DAC in response to the pre-conversion signal or the successive approximation digital code to the DAC at the other time, and a comparator to compare the sampled voltage with the threshold voltage or the comparison voltage to generate a comparison result for the SAR and control circuit. If the sampled voltage is lower than the threshold voltage, the SAR and control circuit asserts an abort signal to abort sensing of the selected trace; otherwise, the SAR and control circuit carries out successive approximation on the trace voltage for the selected trace.

According to the present invention, a detect method of a capacitive touch panel samples the trace voltage of a selected one of the traces of the capacitive touch panel to generate a sampled voltage, compares the sampled voltage with a threshold voltage, aborts sensing of the selected trace if the sampled voltage is lower than the threshold voltage, and carries out successive approximation on the trace voltage if the sampled voltage is higher than the threshold voltage. Preferably, an abort signal is asserted when the sampled voltage is lower than the threshold voltage, to skip the selected trace or fill a zero as the measured capacitance of the selected trace.

BRIEF DESCRIPTION OF THE DRAWINGS

These and other objects, features and advantages of the present invention will become apparent to those skilled in the art upon consideration of the following description of the preferred embodiments of the present invention taken in conjunction with the accompanying drawings, in which.

DETAILED DESCRIPTION OF THE INVENTION

Figure 1:
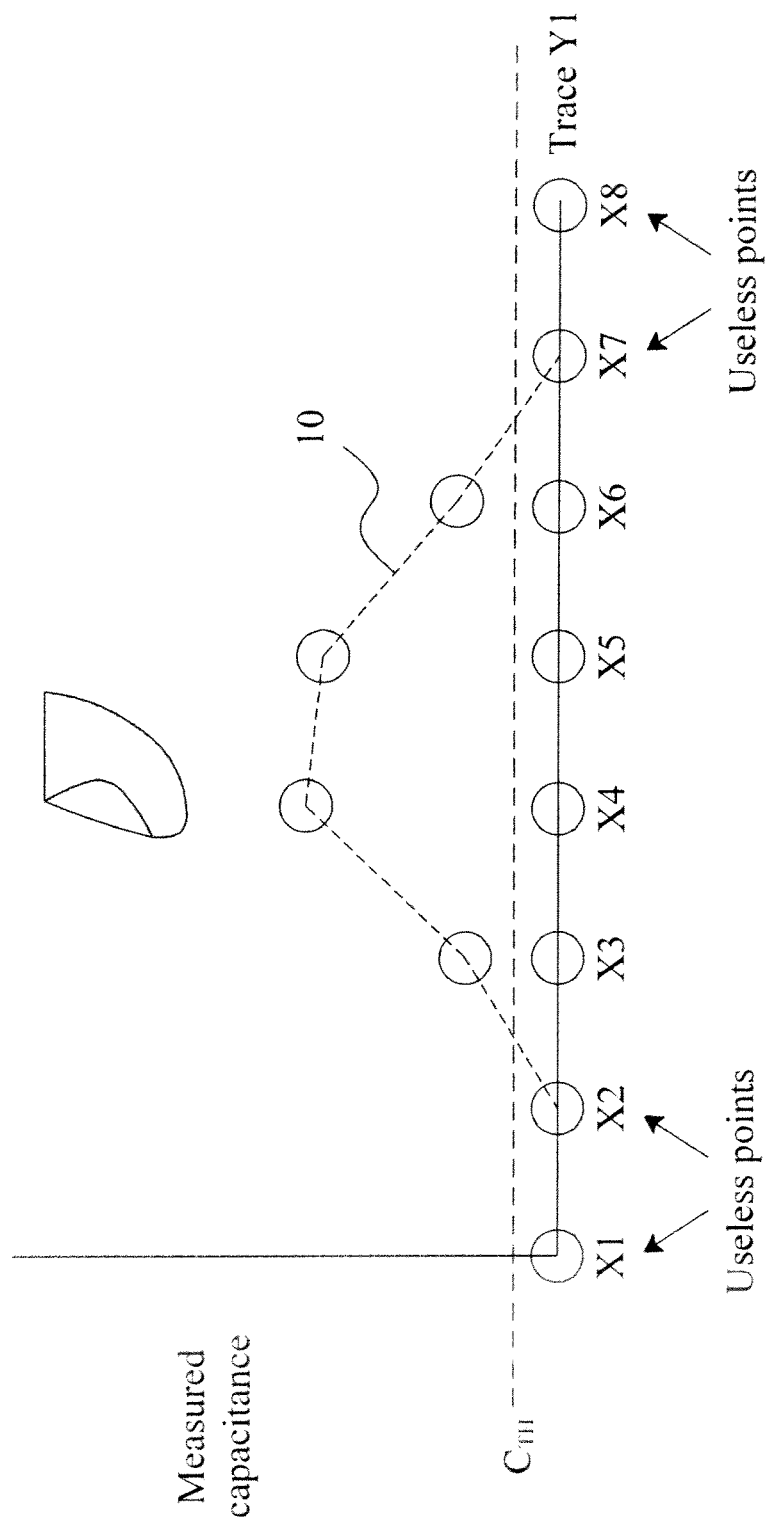
FIG. 1 is a schematic diagram showing the measured capacitances from X-traces along a Y-trace when a finger touches at the intersection of the Y-trace and one of the X-traces.
Figure 2:
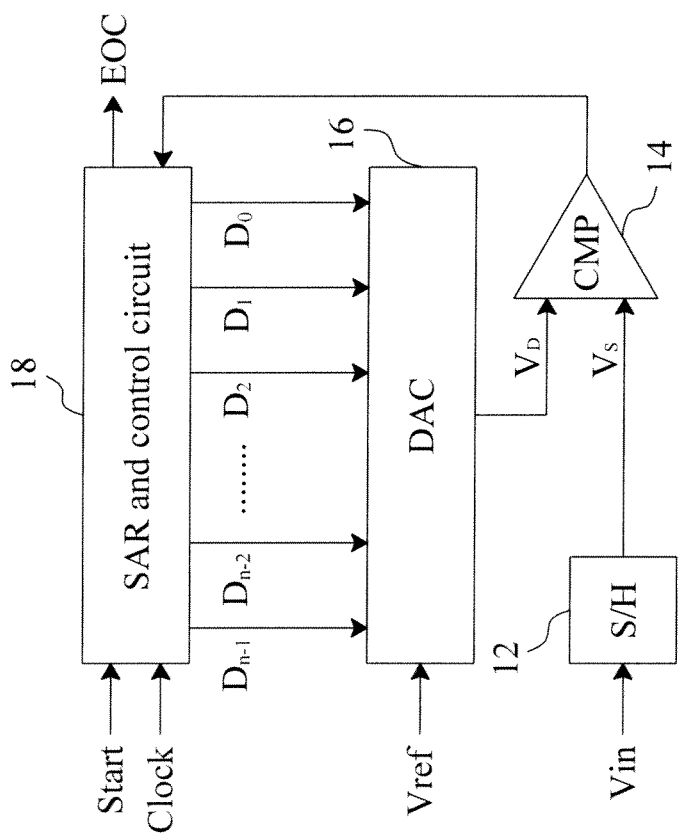
FIG. 2 is a circuit diagram of a conventional SAR ADC.
Figure 3:
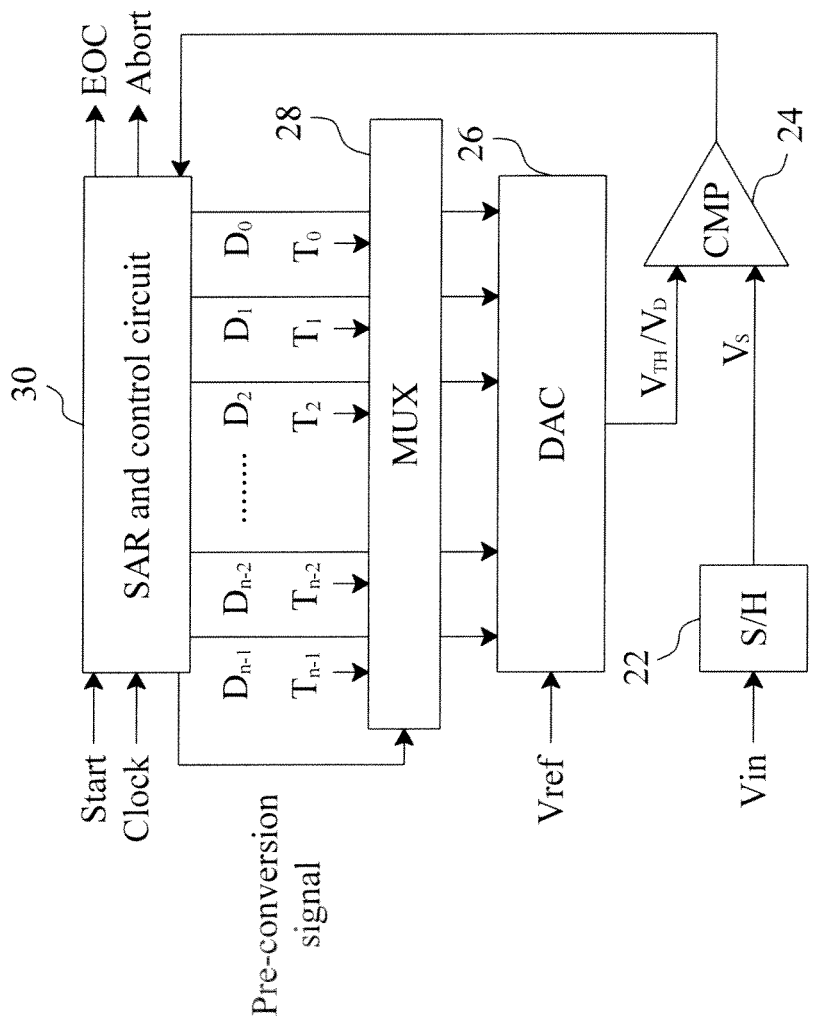
FIG. 3 is a circuit diagram of a detector circuit of a capacitive touch panel according to the present invention.

FIG. 3 is a circuit diagram of a detector circuit of a capacitive touch panel according to the present invention, in which a SAR and control circuit 30 provides a threshold digital code $T_0$-$T_{n-1}$ in addition to a successive approximation digital code $D_0$-$D_{n-1}$, and for a DAC 26, a two-by-one multiplexer 28 provides either the threshold digital code $T_0$-$T_{n-1}$ responsive to a pre-conversion signal from the SAR and control circuit 30 or the successive approximation digital code $D_0$-$D_{n-1}$ at the other time. In some embodiments, a counting method is used instead in the way that after the threshold digital code $T_0$-$T_{n-1}$ is provided to the DAC 26, the successive approximation digital code $D_0$-$D_{n-1}$ will be provided to the DAC 26 in the following n cycles. Referring to FIG. 3, a comparator 24 compares either a threshold voltage $V_{TH}$ or a voltage $V_D$, converted from the threshold digital code $T_0$-$T_{n-1}$ or the successive approximation digital code $D_0$-$D_{n-1}$ by the DAC 26 with reference to a reference voltage Vref, with a sampled voltage $V_S$ generated by a sample-and-hold circuit 22 through sampling to obtain a comparison result for the SAR and control circuit 30. In this embodiment, when beginning to convert a trace voltage Vin, the SAR and control circuit 30 asserts a pre-conversion signal to signal the multiplexer 28 to provide the threshold digital code $T_0$-$T_{n-1}$ for the DAC 26 to convert to the threshold voltage $V_{TH}$. The threshold digital code $T_0$-$T_{n-1}$ is determined by the base voltage of the trace without being touched. If the sampled voltage $V_S$ is lower than the threshold voltage $V_{TH}$, the SAR and control circuit 30 asserts an abort signal Abort to stop sensing this trace, and the process jumps to sense the next trace. If the sampled voltage $V_S$ is higher than the threshold voltage $V_{TH}$, the multiplexer 28 keeps providing the successive approximation digital code $D_0$-$D_{n-1}$ for the DAC 26 to convert to the voltage $V_D$ for carrying out successive approximation for the sensed trace to generate a digital code $D_0$-$D_{n-1}$ for a firmware to fill in a frame as the measured capacitance of the sensed trace, as illustrated in FIG. 1.

Figure 4:
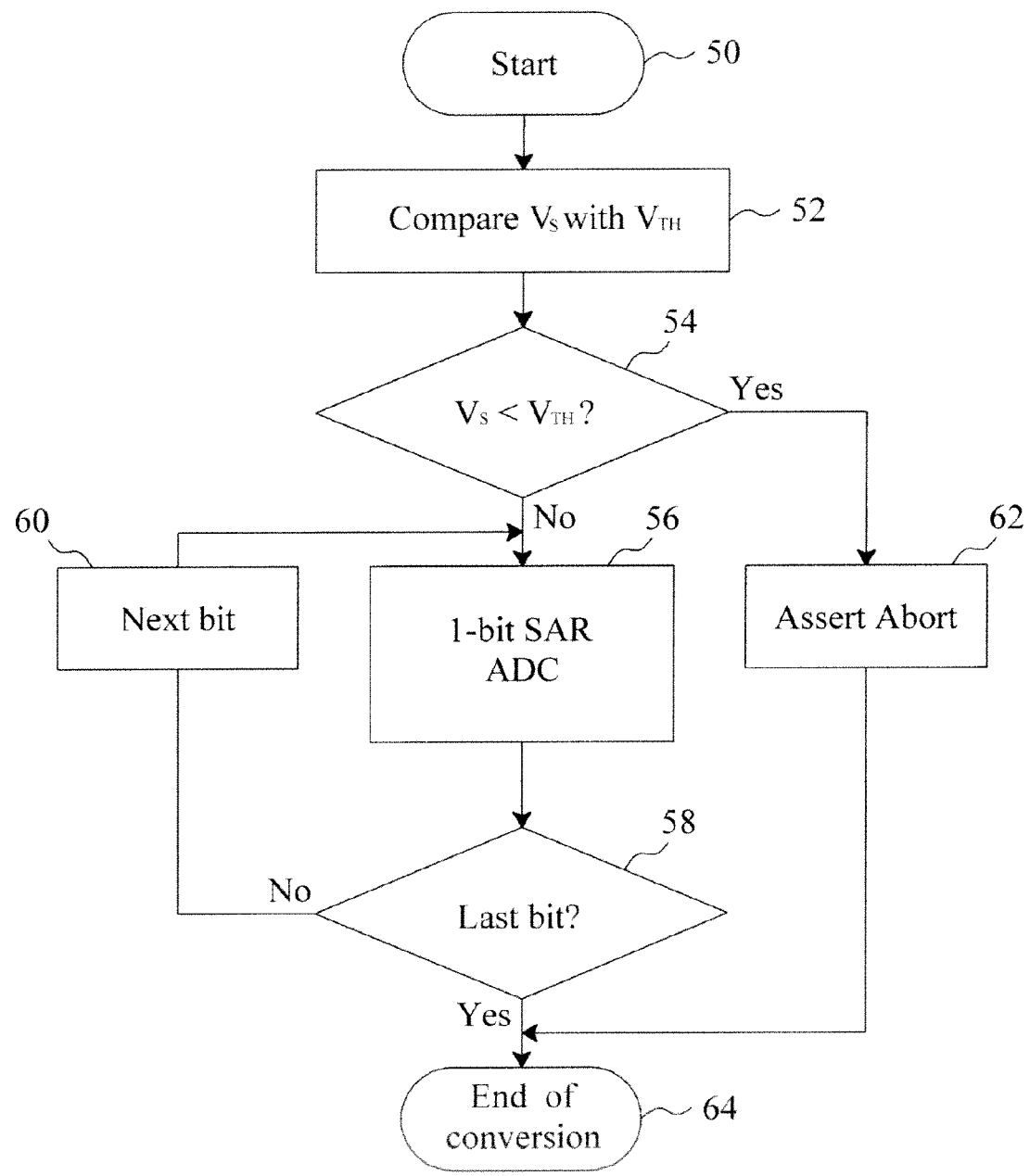
FIG. 4 is a flowchart of a detect method of a capacitive touch panel according to the present invention.

FIG. 4 is a flowchart of a detect method when using the detector circuit shown in FIG. 3. After step 50 to start the process, step 52 compares the sampled voltage $V_S$ with the threshold voltage $V_{TH}$, step 54 identifies whether or not the sampled voltage $V_S$ is lower than the threshold voltage $V_{TH}$. If yes, step 62 asserts the signal Abort to stop sensing this trace, and the process goes on to step 64 to issue a signal end_of__conversion (EOC) to abort the analog-to-digital conversion; otherwise, step 56 continues 1-bit SAR ADC conversion, and step 58 checks whether or not the current bit is the last bit. If the current bit is the last bit, step 64 terminates the analog-to-digital conversion; otherwise, step 60 is executed for the next bit, and then the process returns to step 56.

In the above embodiment, after asserting the abort signal Abort or aborting the current conversion, the process skips the current trace or fill a zero in the frame as the measured capacitance of the current trace by means of software or firmware, thereby taking no further operation on useless traces. In other embodiments, it may use hardware, software or firmware to implement the pre-filtering stage according to the present invention.

In actual circuitry, when constructing a frame of information, a detector circuit of a capacitive touch panel typically senses a trace for two, four, six or even eight times and then senses the next trace with the same steps. Taking a capacitive touch panel having N X-traces and N Y-traces for example, where N is a nature number, to complete a frame, it is necessary to scan 2N (=N+N) traces and each trace has to be sensed for M times, where M is a nature number, so operation for M×2N times is required for a frame. Differently, a detect method according to the present invention is capable of identifying a useless trace upon the first sensing thereto, thus not only to avoid unnecessary subsequent data conversion, but also to avoid repeated scan for useless traces, thereby effectively reducing the operation and in turn improving the frame speed and reducing the power consumption.

While the present invention has been described in conjunction with preferred embodiments thereof, it is evident that many alternatives, modifications and variations will be apparent to those skilled in the art. Accordingly, it is intended to embrace all such alternatives, modifications and variations that fall within the spirit and scope thereof as set forth in the appended claims.

What is claimed is:

1. A detector circuit of a capacitive touch panel having a plurality of traces, the detector circuit comprising:
   a sample-and-hold circuit for sampling a trace voltage of a selected one of the plurality of traces to generate a sampled voltage;
   a successive approximation register and control circuit for providing a threshold digital code and a successive approximation digital code, and providing a pre-conversion signal when beginning to convert the sampled voltage;
   a digital-to-analog converter for converting the threshold digital code into a threshold voltage or converting the successive approximation digital code into a comparison voltage;
   a multiplexer connected between the successive approximation register and control circuit and the digital-to-analog converter, for providing either the threshold digital code to the digital-to-analog converter in response to the pre-conversion signal, or the successive approximation digital code to the digital-to-analog converter at the other time; and
   a comparator connected to the digital-to-analog converter and the sample-and-hold circuit for comparing the sampled voltage with the threshold voltage or the comparison voltage to generate a comparison result for the successive approximation register and control circuit;
   wherein if the sampled voltage is lower than the threshold voltage, the successive approximation register and control circuit asserts an abortion signal to abort sensing of the selected trace; otherwise, the successive approximation register and control circuit carries out successive approximation on the trace voltage for the selected trace.

2. A detect method of a capacitive touch panel having a plurality of traces, the detect method comprising the steps of:
   (a) sampling a trace voltage of a selected one of the plurality of traces to generate a sampled voltage;
   (b) comparing the sampled voltage with a threshold voltage;
   (c) when the sampled voltage is lower than the threshold voltage, aborting sensing of the selected trace; and
   (d) when the sampled voltage is higher than the threshold voltage, carrying out successive approximation on the trace voltage for the selected trace.

3. The detect method of claim 2, further comprising the step of converting a threshold digital code into the threshold voltage.

4. The detect method of claim 2, wherein the step (c) comprises the steps of:
  asserting an abort signal when the sampled voltage is lower than the threshold voltage; and
  responsive to the abort signal, aborting conversion of the sampled voltage and skipping the selected trace.

5. The detect method of claim 2, wherein the step (c) comprises the steps of:
  asserting an abort signal when the sampled voltage is lower than the threshold voltage; and
  responsive to the abort signal, aborting conversion of the sampled voltage and filling a zero as a measured capacitance of the selected trace.

\* \* \* \* \*